United States Patent
Kawai et al.

(10) Patent No.: US 12,055,220 B2
(45) Date of Patent: Aug. 6, 2024

(54) SEALING EQUIPMENT

(71) Applicant: Sinfonia Technology Co., Ltd., Tokyo (JP)

(72) Inventors: Toshihiro Kawai, Tokyo (JP); Gengoro Ogura, Tokyo (JP)

(73) Assignee: Sinfonia Technology Co., Ltd., Tokyo (JP)

( * ) Notice: Subject to any disclaimer, the term of this patent is extended or adjusted under 35 U.S.C. 154(b) by 979 days.

(21) Appl. No.: 16/980,638

(22) PCT Filed: Mar. 13, 2019

(86) PCT No.: PCT/JP2019/010351
§ 371 (c)(1),
(2) Date: Sep. 14, 2020

(87) PCT Pub. No.: WO2019/177047
PCT Pub. Date: Sep. 19, 2019

(65) Prior Publication Data
US 2021/0010598 A1    Jan. 14, 2021

(30) Foreign Application Priority Data
Mar. 15, 2018   (JP) .................................. 2018-048421

(51) Int. Cl.
*B23P 19/00*    (2006.01)
*F16J 15/10*    (2006.01)
*H01L 21/673*   (2006.01)

(52) U.S. Cl.
CPC ....... *F16J 15/108* (2013.01); *H01L 21/67376* (2013.01)

(58) Field of Classification Search
CPC ............... H01L 21/02; H01L 21/67017; H01L 21/67126; H01L 21/67376;
(Continued)

(56) References Cited

U.S. PATENT DOCUMENTS 4,829,158 A * 5/1989 Burnham ............... F24C 15/325
219/400
2005/0232654 A1 * 10/2005 Karakama .......... G03G 15/0894
399/109
(Continued)

FOREIGN PATENT DOCUMENTS

JP    H10129258    5/1998
JP    2007046657 A  2/2007
(Continued)

OTHER PUBLICATIONS

Japan Patent Application No. PCT/JP2019/010351, International Search Report (and translation) and Written Opinion, dated May 14, 2019.

(Continued)

*Primary Examiner* — Paul D Kim
(74) *Attorney, Agent, or Firm* — Kilpatrick Townsend & Stockton LLP (57) ABSTRACT

A housing is made sealable even when the rigidity of a frame member and a cover member is not high. In an EFEM, a pressure difference having a predetermined value or less exists between an internal space of a housing and an external space of the housing. The housing includes a frame member assembled so as to form an opening, a cover member attached to the frame member so as to cover the opening, and a seal member sandwiched between the frame member and the cover member and configured to extend so as to surround the opening. The frame member and the cover member are formed of a sheet metal. The seal member is an elastic member having a hollow cross section orthogonal to an extension direction of the seal member.

13 Claims, 8 Drawing Sheets

(58) Field of Classification Search
CPC .. H01L 21/67766; F16J 15/025; F16J 15/027; F16J 15/108
See application file for complete search history.

(56) References Cited

U.S. PATENT DOCUMENTS

2009/0272279 A1* 11/2009 Kieck ...................... A47J 47/10
                                                              99/468
2017/0224431 A1*  8/2017 Mitchell ................ E05C 19/14

FOREIGN PATENT DOCUMENTS

| JP | 2010084927 A | 4/2010 |
|---|---|---|
| JP | 2010256311 A | 11/2010 |
| JP | 2010276620 A | 12/2010 |
| JP | 2013170956 A | 9/2013 |
| JP | 2014232078 A | 12/2014 |
| JP | 2015146349 A | 8/2015 |
| JP | 2016137151 A | 8/2016 |
| KR | 1020070076491 | 7/2007 |

OTHER PUBLICATIONS

Korea Patent Application No. 10-2020-7026452, Office Action, dated Oct. 27, 2023.

* cited by examiner

SEALING EQUIPMENT

CROSS-REFERENCE TO RELATED APPLICATIONS

This application is a national phase entry under 35 USC § 371 of International Application PCT/JP2019/010351 ("the '351 application"), filed Mar. 13, 2019, which application claims priority to and benefits of Japan Patent Application No. 2018-048421 ("the '421 application"), filed on Mar. 15, 2018. The '351 application and the '421 applications are hereby incorporated in their entireties by this reference.

TECHNICAL FIELD

The present disclosure relates to a sealing equipment.

BACKGROUND

Patent Document 1 discloses an EFEM (Equipment Front End Module) configured to deliver a wafer between a processing apparatus that performs a predetermined process on a semiconductor substrate (wafer) and an FOUP (Front-Opening Unified Pod) pod that accommodates the wafer. The EFEM includes a housing in which a transfer chamber for transferring a wafer is formed, a plurality of load ports arranged side by side on the outside of the housing and respectively mounted with an FOUP, and a transfer device installed inside the transfer chamber and configured to transfer the wafer.

Conventionally, the influence of oxygen, moisture and the like in a transfer chamber on a semiconductor circuit manufactured on a wafer has been small. However, in recent years, such influence has become apparent as a semiconductor circuit is further miniaturized. Therefore, the EFEM described in Patent Document 1 is configured such that the transfer chamber is filled with nitrogen which is an inert gas. Specifically, the EFEM includes a circulation flow path configured to circulate nitrogen inside the housing and provided with a transfer chamber, a gas supply unit configured to supply nitrogen to the circulation flow path, and a gas discharge unit configured to discharge nitrogen from the circulation flow path. Nitrogen is appropriately supplied and discharged according to a change in the oxygen concentration in the circulation flow path. Thus, as compared with a configuration in which nitrogen is constantly supplied and discharged, it becomes possible to maintain the inside of the transfer chamber in a nitrogen atmosphere while suppressing an increase in the supply amount of nitrogen. Furthermore, the circulation flow path is a substantially sealed space which is sealed by a housing wall (cover member) that surrounds the housing and columns (frame members) that support the housing wall. As a result, it is possible to suppress invasion of the ambient air from the external space into the circulation flow path and leakage of nitrogen from the circulation flow path into the external space.

PRIOR ART DOCUMENT

Patent Document

Patent Document 1: Japanese laid-open publication No. 2015-146349

In the EFEM as described in Patent Document 1, in order to actually form a substantially sealed space, the present inventor has studied to close a housing by crushing an O-ring sandwiched between a frame member and a cover member so that the O-ring makes close contact with the frame member and the cover member. In order to crush the O-ring, it is necessary to apply a pressing force of a certain level or more, and it is required to thicken the frame member and the cover member so that the frame member and the cover member have rigidity to withstand the pressing force. However, when the frame member and the cover member are thickened, the weight of the frame member and the cover member is considerably increased, and the manufacturing cost such as the material cost or the like is significantly increased. In addition, for example, when the cover member is attached and detached at the time of maintenance of the EFEM, it is necessary to carry the heavy cover member, which causes a problem that the workability is extremely deteriorated. Furthermore, high flatness is required on the surface.

The present disclosure provides some embodiments of a technique capable of sealing a housing even when the rigidity of a frame member and a cover member is not high.

SUMMARY

A first aspect of the present disclosure provides a sealing equipment in which a pressure difference having a predetermined value or less exists between an internal space of a housing and an external space of the housing, the housing including: a frame member assembled so as to form an opening; a cover member attached to the frame member so as to cover the opening; and a seal member sandwiched between the frame member and the cover member and configured to extend so as to surround the opening, wherein the frame member and the cover member are formed of a sheet metal, and wherein the seal member is an elastic member having a hollow cross section orthogonal to an extension direction of the seal member.

According to this aspect, the seal member is an elastic member having a hollow cross section and is, therefore, easily bent even with a small pressing force. That is, the seal member sandwiched between the frame member and the cover member is easily compressed, and the contact areas between the seal member and the frame member and between the seal member and the cover member is easily increased. Therefore, the seal member can be brought into close contact with the frame member and the cover member with a small pressing force. As a result, even when the frame member and the cover member are formed of a sheet metal having low rigidity, the frame member and the cover member can withstand the pressing force for compressing the seal member. When the pressure difference between the internal space and the external space is large, the hollow seal member is apt to deteriorate in sealability because the seal member is compressed from the high pressure side to the low pressure side. However, in the present disclosure, the pressure difference between the internal space and the external space is small (for example, 1 to 3000 Pa(G), preferably 3 to 500 Pa(G), and more preferably 5 to 100 Pa(G)). Therefore, the deterioration of sealability is suppressed. As described above, the housing can be sealed even when the frame member and the cover member do not have high rigidity.

According to a second aspect of the present disclosure, in the sealing equipment of the first aspect, a gas vent hole configured to bring a hollow of the seal member and the external space into communication with each other may be formed in the seal member.

According to this aspect, when the cover member is attached to the frame member, i.e., when the seal member is compressed, a gas is discharged from the hollow of the seal member through the gas vent hole. Therefore, as compared with a case where the gas vent hole is not formed, it is possible to suppress the pressure in the hollow from rising at the time of compressing the seal member, and to weaken the repulsive force applied by the seal member. Accordingly, the seal member can be reliably compressed with a small pressing force.

According to a third aspect of the present disclosure, in the sealing equipment of the first or second aspect, a spacer may be arranged between the frame member and the cover member.

When the seal member is used in a state in which it is excessively compressed and is completely crushed, the seal member may be easily damaged. According to this aspect, the spacer maintains the distance between the frame member and the cover member. Therefore, the thickness of the seal member is prevented from becoming smaller than the above distance. Accordingly, by appropriately maintaining the distance between the frame member and the cover member, it is possible to prevent the seal member from being overcompressed.

According to a fourth aspect of the present disclosure, in the sealing equipment of any one of the first to third aspects, the seal member may include a protrusion formed in a portion that makes contact with one of the frame member and the cover member, and the protrusion extends in a width direction of the seal member, which is orthogonal to the extension direction and parallel to a surface of one of the frame member and the cover member that makes contact with the seal member.

According to this aspect, the contact area between the seal member and one of the frame member and the cover member can be increased by the protrusion protruding in the width direction. Therefore, it is possible to improve the sealability of the housing.

According to a fifth aspect of the present disclosure, in the sealing equipment of the fourth aspect, the protrusion may be formed only on the side of one of the internal space and the external space, whichever has a lower pressure, in the width direction.

When the protrusion is formed on the side of one of the internal space or the external space, whichever has a higher pressure, if the pressure difference between the internal space and the external space increases, the resistance of the protrusion makes it difficult for the seal member to move as the seal member is pressed from the high pressure side to the low pressure side. That is, it is difficult for the gas to escape from the space having a high pressure to the space having a low pressure. Then, if the pressure difference continues to increase, the hollow seal member having low strength may be broken. In the present disclosure, when the pressure difference between the internal space and the external space is increased, the gas relatively easily escapes from the space having a high pressure to the space having a low pressure. Therefore, the seal member can be prevented from being broken.

A sixth aspect of the present disclosure provides a sealing equipment in which a pressure difference of 3000 Pa or less exists between an internal space of a housing and an external space of the housing, the housing including: a frame member assembled so as to form an opening; a cover member attached to the frame member so as to cover the opening; and a seal member sandwiched between the frame member and the cover member and configured to extend so as to surround the opening, wherein at least one of the frame member and the cover member is formed of a sheet metal having a thickness of 6 mm or less, wherein the frame member and the cover member include contact surfaces that make contact with the seal member and have a flatness of 0.5 mm/m to 5 mm/m, and wherein the seal member is an elastic member having a hollow cross section orthogonal to an extension direction of the seal member.

According to this aspect, even when a sheet metal having a surface flatness inferior to the case where the frame member or the cover member is manufactured by a cutting process is used for the frame member or the cover member, the seal member is deformed by a small pressing force so as to follow the surface. Therefore, it is possible to obtain the required sealability.

According to a seventh aspect of the present disclosure, the sealing equipment of any one of the first to sixth aspects may include: a gas supply unit configured to supply an inert gas; a gas discharge unit configured to discharge a gas in the internal space; and a controller configured to control the gas supply unit and the gas discharge unit, wherein the controller may be configured to maintain an oxygen concentration in the internal space at less than 100 ppm by supplying the inert gas at 200 L/min or less with the gas supply unit and by discharging the gas with the gas discharge unit according to a supply amount of the gas or a pressure in the internal space.

According to this aspect, the housing can be sealed and the gas can be prevented from entering the internal space from the external space. Therefore, even when the supply flow rate of the inert gas is as small as 200 L/min or less, it is possible to prevent the concentration of gases other than the inert gas from increasing.

DETAILED DESCRIPTION

Figure 1:
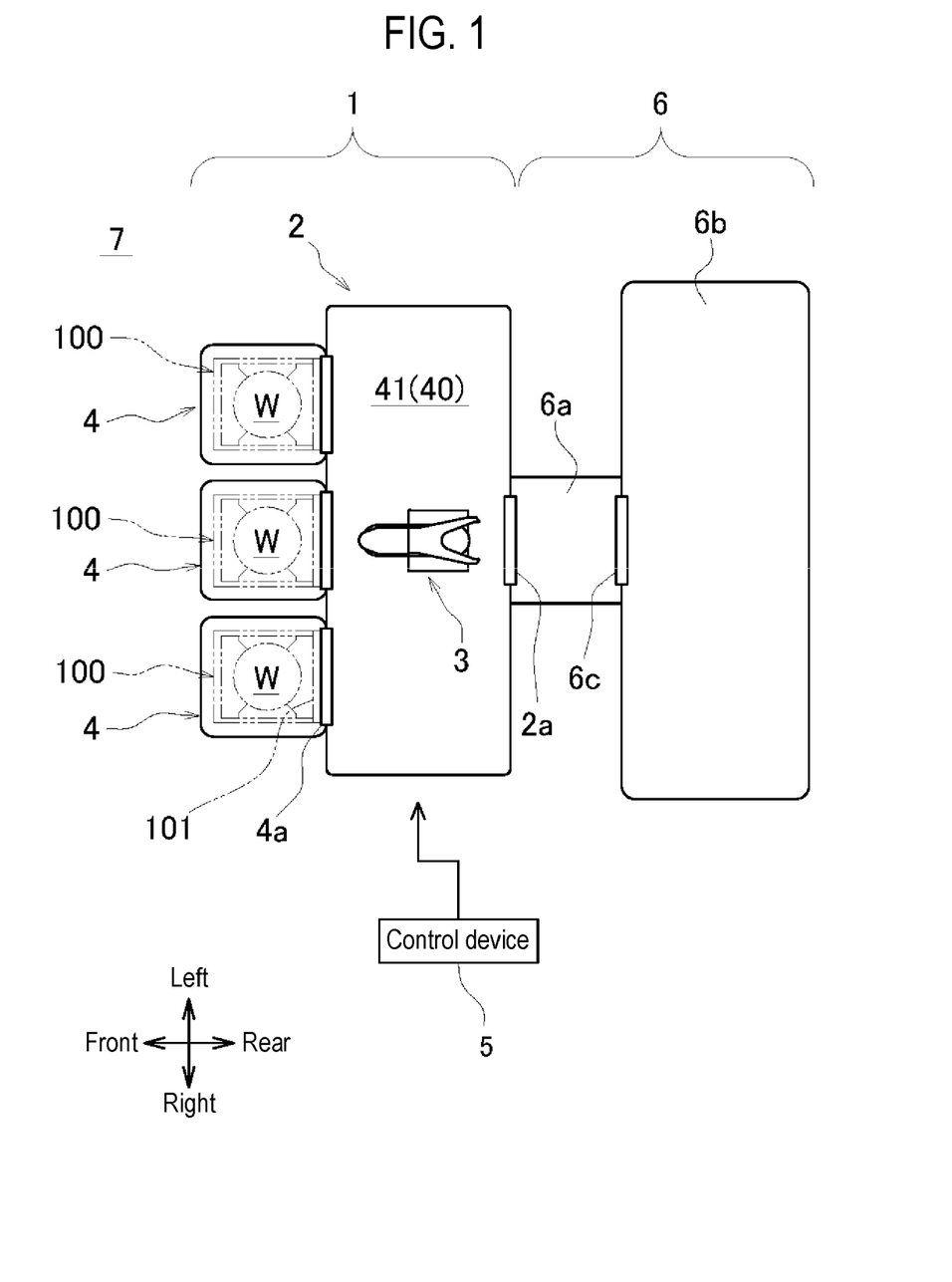
FIG. 1 is a schematic plan view of an EFEM according to the present embodiment and surroundings thereof.

Next, an embodiment of the present disclosure will be described with reference to FIGS. 1 to 7B. For the convenience of explanation, the directions shown in FIG. 1 are defined as front, rear, left, and right directions. That is, the direction in which an EFEM (Equipment Front End Module) 1 and a substrate processing apparatus 6 are arranged side by side is defined as a front-rear direction. The side of the EFEM 1 is defined as a front side, and the side of the substrate processing apparatus 6 is defined as a rear side. The direction in which a plurality of load ports 4 is arranged side by side and which is orthogonal to the front-rear direction, is defined as a left-right direction. In addition, the direction orthogonal to both of the front-rear direction and the left-right direction is defined as an up-down direction.

Schematic Configuration of EFEM and Surroundings Thereof

Figure 2:
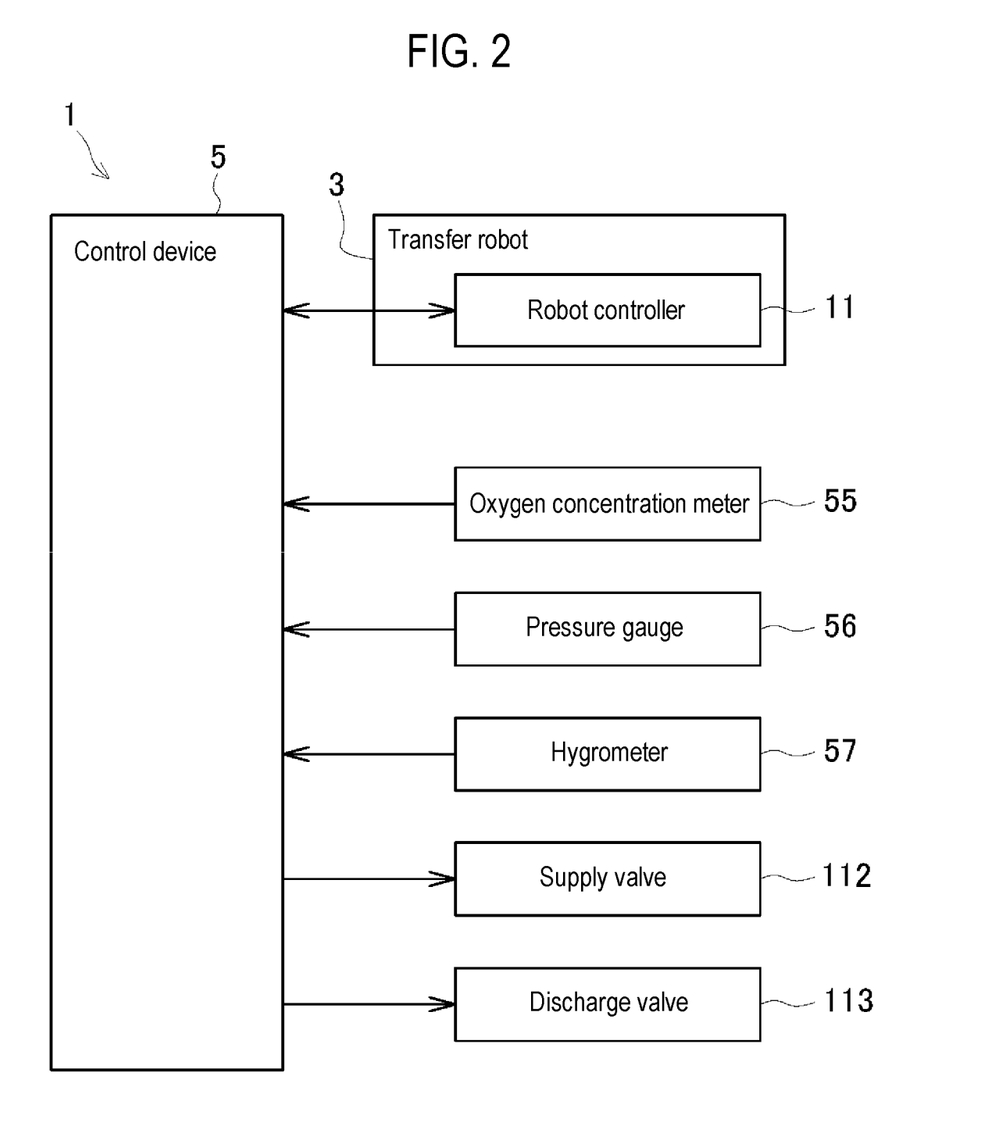
FIG. 2 is a diagram showing an electrical configuration of the EFEM.

First, the schematic configuration of the EFEM 1 (the sealing equipment of the present disclosure) and surroundings thereof will be described with reference to FIGS. 1 and 2. FIG. 1 is a schematic plan view of the EFEM 1 according to the present embodiment and the surroundings thereof. FIG. 2 is a diagram showing an electrical configuration of the EFEM 1. As shown in FIG. 1, the EFEM 1 includes a housing 2, a transfer robot 3, the plurality of load ports 4, and a control device 5. The substrate processing apparatus 6 that performs a predetermined process on a wafer W as a semiconductor substrate is arranged behind the EFEM 1. The EFEM 1 delivers the wafer W between an FOUP (Front-Opening Unified Pod) 100 mounted on the load port 4 and the substrate processing apparatus 6 using the transfer robot 3 arranged in the housing 2. The FOUP 100 is a container capable of accommodating a plurality of wafers W side by side in the up-down direction, and has a lid 101 attached to the rear end portion thereof (the end portion on the side of the housing 2 in the front-rear direction). The FOUP 100 is transferred by, for example, an OHT (overhead traveling automatic transfer vehicle) (not shown) that travels in a state in which it is suspended by a rail (not shown) provided above the load port 4. The FOUP 100 is delivered between the OHT and the load port 4.

The housing 2 is used to connect the plurality of load ports 4 and the substrate processing apparatus 6. Inside the housing 2, there is formed a transfer chamber 41 which is substantially sealed from the external space and in which the wafer W is transferred. When the EFEM 1 is operating, the transfer chamber 41 is filled with an inert gas such as nitrogen or the like. The housing 2 is configured so that nitrogen circulates through the internal space including the transfer chamber 41 (details will be described later). Furthermore, a door 2a is attached to the rear end portion of the housing 2. The transfer chamber 41 is connected to the substrate processing apparatus 6 with the door 2a interposed therebetween.

The transfer robot 3 is arranged in the transfer chamber 41 and configured to transfer the wafer W. The transfer robot 3 includes a base 3a (see FIG. 3) having a fixed position, an arm mechanism 3b (see FIG. 3) arranged above the base 3a to hold and transfer the wafer W, and a robot controller 11 (see FIG. 2). The transfer robot 3 mainly performs an operation of taking out the wafer W from the FOUP 100 and delivering the wafer W to the substrate processing apparatus 6, and an operation of receiving the wafer W processed by the substrate processing apparatus 6 and returning the wafer W to the FOUP 100.

Figure 5:
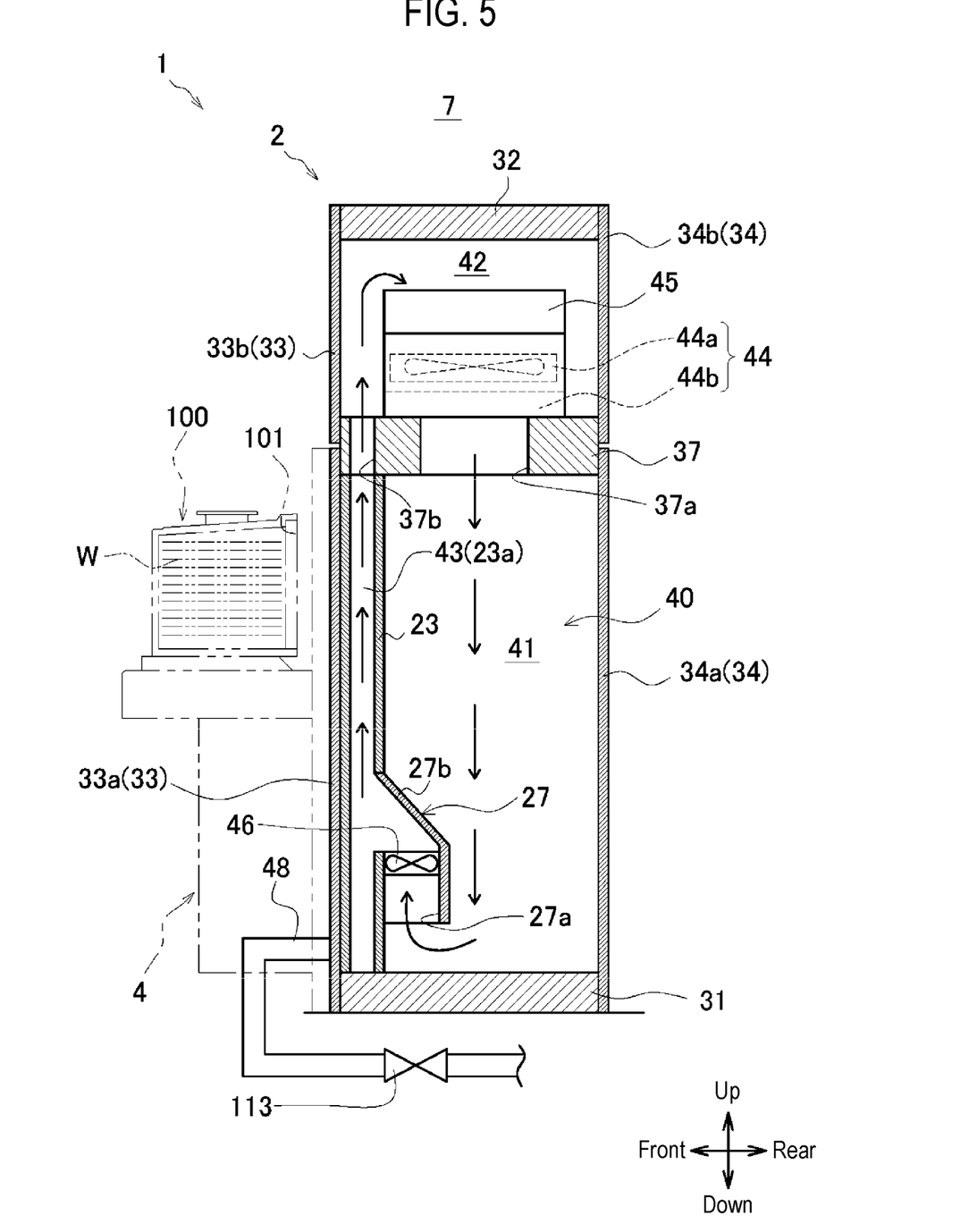
FIG. 5 is a sectional view taken along line V-V in FIG. 3.

The load port 4 is used to mount the FOUP 100 (see FIG. 5). The plurality of load ports 4 is arranged side by side in the left-right direction so that the rear end portions thereof extend along a partition wall on the front side of the housing 2. The load port 4 is configured to be able to replace the atmosphere inside the FOUP 100 with an inert gas such as nitrogen or the like. A door 4a is provided at the rear end portion of the load port 4. The door 4a is opened and closed by a door opening/closing mechanism (not shown). The door 4a is configured to be able to unlock the lid 101 of the FOUP 100 and hold the lid 101. The lid 101 is opened as the door opening/closing mechanism opens the door 4a in a state in which the door 4a holds the unlocked lid 101. As a result, the wafer W in the FOUP 100 can be taken out by the transfer robot 3.

As shown in FIG. 2, the control device 5 (a controller of the present disclosure) is electrically connected to the robot controller 11 of the transfer robot 3, a controller (not shown) of the load port 4, and a controller (not shown) of the substrate processing apparatus 6 so as to make communication with these controllers. Furthermore, the control device 5 is electrically connected to an oxygen concentration meter 55, a pressure gauge 56, a hygrometer 57 and the like, which are installed inside the housing 2. The control device 5 receives measurement results of these measurement instruments to recognize information regarding the atmosphere inside the housing 2. Moreover, the control device 5 is electrically connected to a supply valve 112 and a discharge valve 113 (described later). The control device 5 adjusts opening degrees of these valves to appropriately adjust the atmosphere inside the housing 2. For example, in the EFEM 1 of the type in which nitrogen is circulated, it is necessary to maintain the pressure in an internal space 40 slightly higher than the pressure in an external space 7 in order to reliably suppress the invasion of the ambient air from the outside to the internal space 40 while suppressing the leakage of nitrogen from the internal space 40 to the external space 7. Specifically, the pressure in the internal space 40 may be in a range of 1 Pa(G) to 3000 Pa(G), preferably 3 Pa(G) to 500 Pa(G), and more preferably 5 Pa(G) to 100 Pa(G). Therefore, when the pressure in the internal space 40 deviates from a predetermined range, the control device 5 changes a discharge flow rate of nitrogen by changing the opening degree of the discharge valve 113, and adjusts the pressure in the internal space 40 to become a predetermined target pressure. As described above, a supply flow rate of nitrogen is adjusted based on the oxygen concentration and the discharge flow rate of nitrogen is adjusted based on the pressure, whereby the oxygen concentration and the pressure are controlled. In the present embodiment, the pressure is adjusted so that the pressure difference becomes 10 Pa(G).

As shown in FIG. 1, the substrate processing apparatus 6 includes, for example, a load lock chamber 6a and a processing chamber 6b. The load lock chamber 6a is a chamber connected to the transfer chamber 41 across the door 2a of the housing 2 and configured to temporarily hold the wafer W. The processing chamber 6b is connected to the load lock chamber 6a via a door 6c. In the processing chamber 6b, a predetermined process is performed on the wafer W by a processing mechanism (not shown).

Housing and Internal Configuration Thereof

Figure 3:
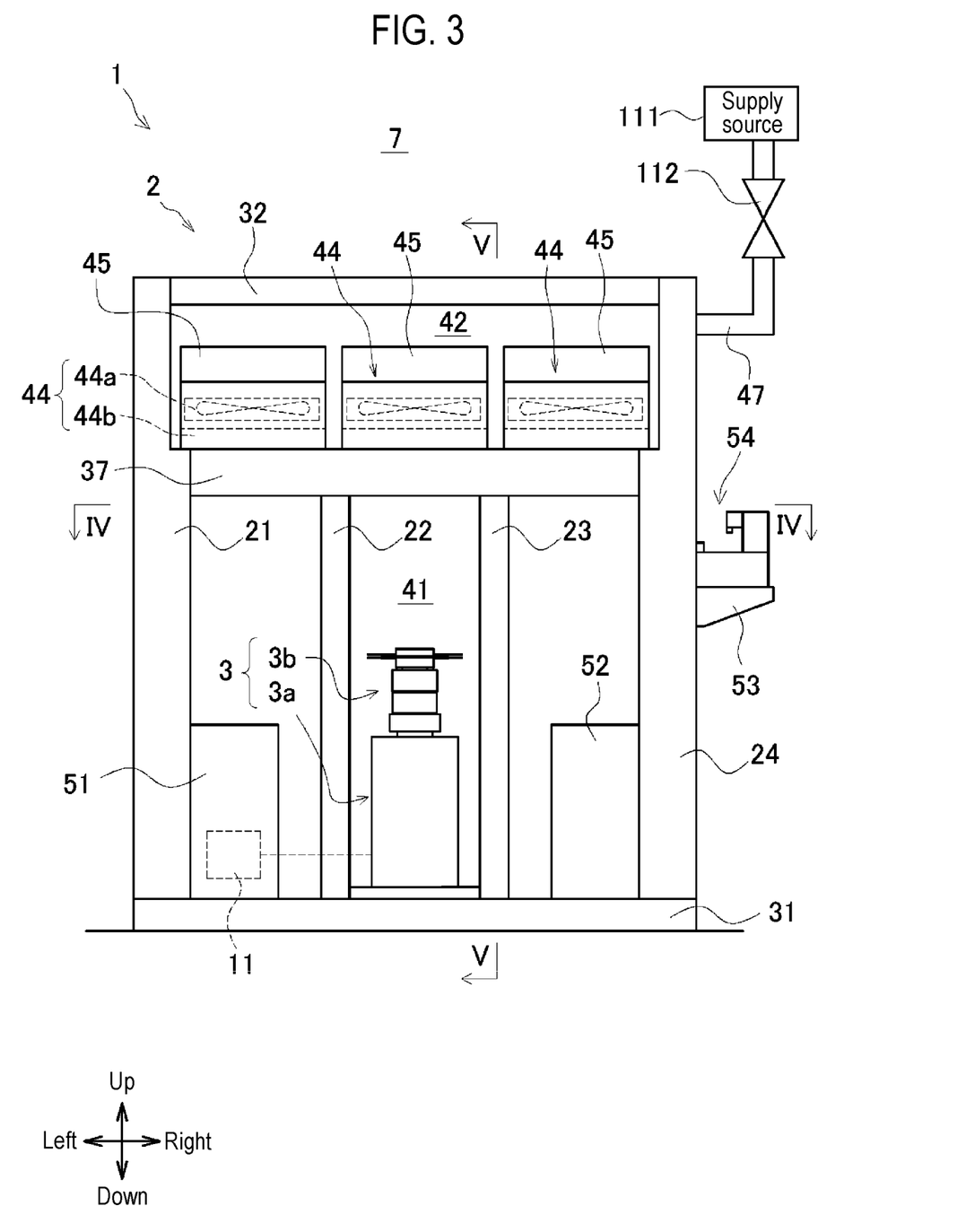
FIG. 3 is a front view of a housing.
Figure 4:
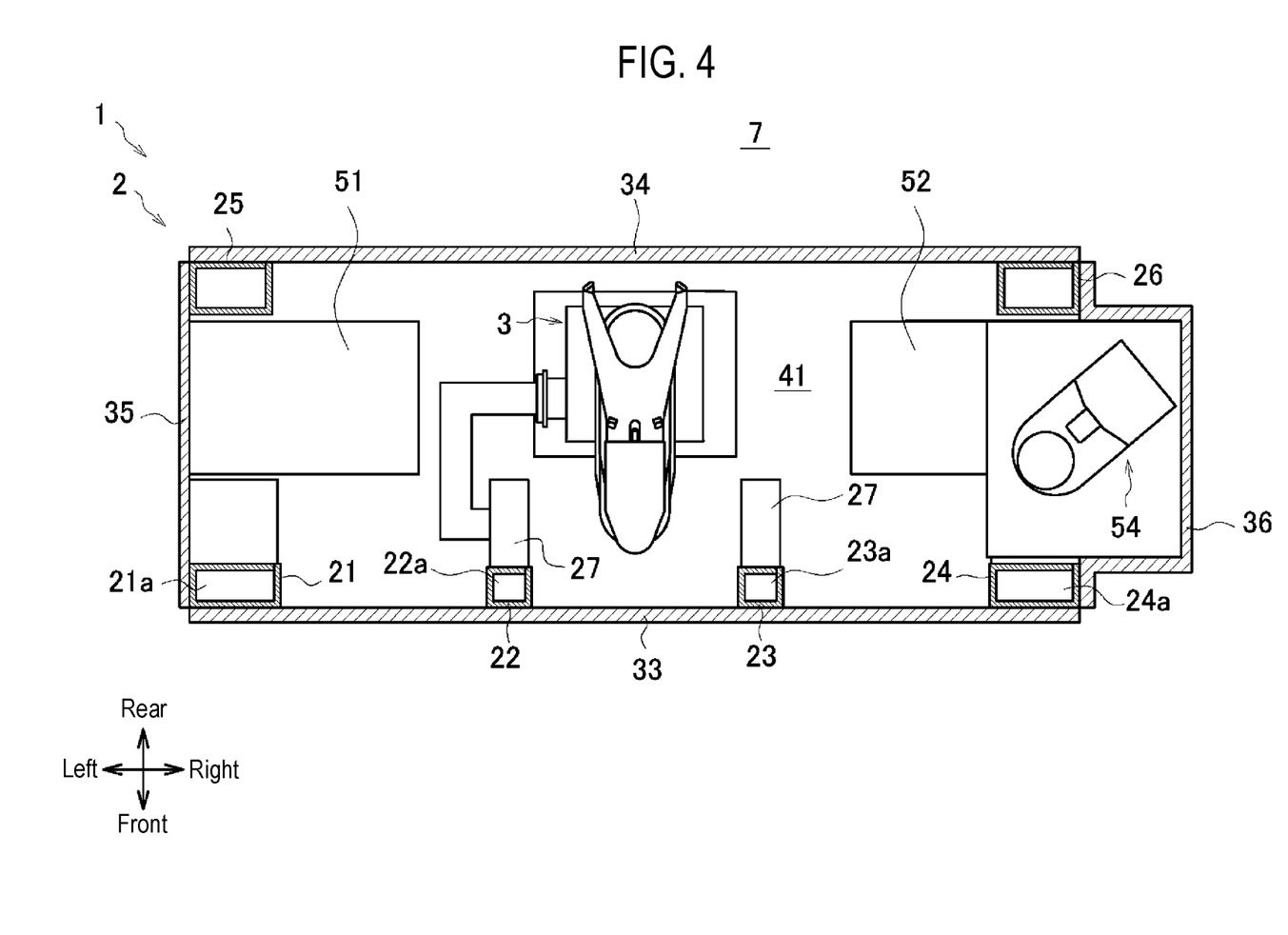
FIG. 4 is a sectional view taken along line IV-IV in FIG. 3.
Figure 6:
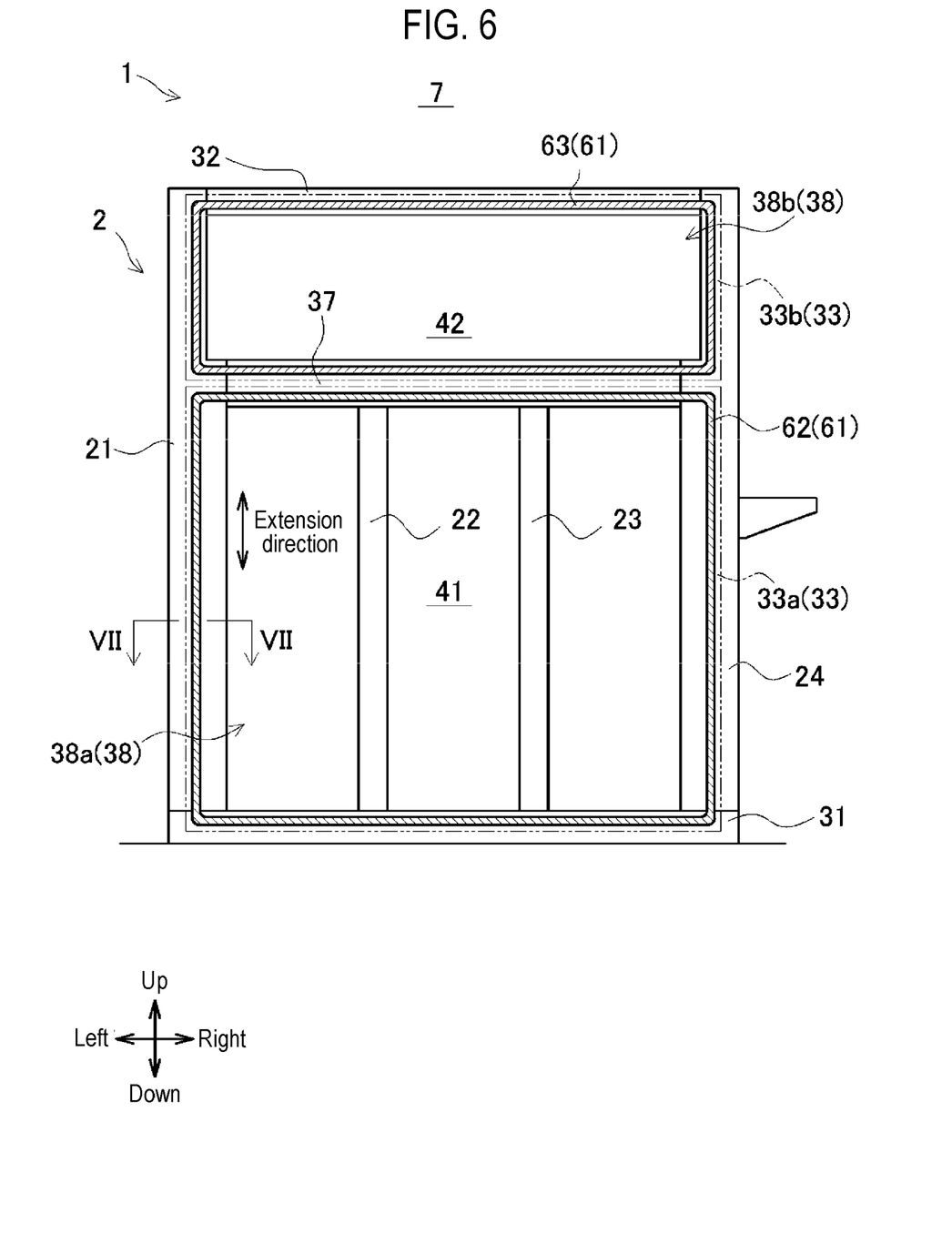
FIG. 6 is a view showing a seal member arranged on a front surface of the housing.

Next, the housing 2 and the internal structure thereof will be described with reference to FIGS. 3 to 6. FIG. 3 is a front view of the housing 2. FIG. 4 is a sectional view taken along line IV-IV in FIG. 3. FIG. 5 is a sectional view taken along line V-V in FIG. 3. FIG. 6 is a view showing a below-described seal member 61 arranged on the front surface of the housing 2. In FIG. 3, illustration of the partition walls is omitted. In FIG. 5, illustration of the transfer robot 3 and the like is omitted.

The housing 2 has a rectangular parallelepiped shape as a whole. As shown in FIGS. 3 to 6, the housing 2 includes columns 21 to 26 and partition walls 31 to 36. The partition walls 31 to 36 are attached to the columns 21 to 26 extending in the up-down direction. Thus, the internal space 40 of the housing 2 is substantially sealed from the external space 7.

More specifically, as shown in FIG. 4, at the front end portion of the housing 2, the columns 21 to 24 are sequentially arranged upright from the left side to the right side. The columns 22 and 23 arranged between the columns 21 and 24 are shorter than the columns 21 and 24. The columns 25 and 26 are arranged upright on the left and right sides of the rear end portion of the housing 2. The columns 21 to 26 are formed of a general sheet metal (rolled metal plate having a thickness of 6 mm or less) made of, e.g., carbon steel such as SPCC material or the like.

As shown in FIG. 3, the partition wall 31 is arranged at the bottom of the housing 2, and the partition wall 32 is arranged at the ceiling of the housing 2. As shown in FIG. 4, the partition wall 33 is arranged at the front end portion, the partition wall 34 is arranged at the rear end portion, the partition wall 35 is arranged at the left end portion, and the partition wall 36 is arranged at the right end portion. A mounting part 53 (see FIG. 3) on which an aligner 54 described later is mounted is provided at the right end portion of the housing 2. The aligner 54 and the mounting part 53 are also accommodated inside the housing 2 (see FIG. 4).

As shown in FIGS. 3 and 5, a support plate 37 that extends in the horizontal direction is arranged in an upper portion inside the housing 2 (above the columns 22 and 23). As a result, the inside of the housing 2 is divided into the above-described transfer chamber 41 formed on the lower side and an FFU installation chamber 42 formed on the upper side. An FFU (fan filter unit) 44 described later is arranged in the FFU installation chamber 42. An opening 37a that brings the transfer chamber 41 and the FFU installation chamber 42 into communication with each other is formed at the center of the support plate 37 in the front-rear direction. The partition walls 33 to 36 of the housing 2 are divided into lower partition walls for the transfer chamber 41 and upper partition walls for the FFU installation chamber 42 (see, e.g., partition walls 33a and 33b at the front end portion and partition walls 34a and 34b at the rear end portion in FIG. 5). The partition walls 31 to 36 and the support plate 37 are also formed of a sheet metal just like the columns 21 to 26.

The housing 2 will be described in more detail. In the housing 2, the columns 21 to 26, the partition walls 31 and 32 and the support plate 37 are assembled (see FIGS. 3 and 4) so that a plurality of openings 38 is formed as shown in FIG. 6. For example, an opening 38a is formed at the lower portion of the front end portion of the housing 2 by the column 21, the column 24, the partition wall 31 and the support plate 37. An opening 38b is formed at the upper portion of the front end portion of the housing 2 by the column 21, the column 24, the partition wall 32 and the support plate 37. The partition walls 33 to 36 (see FIG. 4) are attached to the columns 21 to 26, the partition walls 31 and 32, and the support plate 37 so as to cover the openings 38. The columns 21 to 26, the partition walls 31 and 32, and the support plate 37 (hereinafter referred to as the column 21 and the like) correspond to a frame member of the present disclosure. The partition walls 33 to 36 (hereinafter referred to as the partition wall 33 and the like) correspond to a cover member of the present disclosure. As shown in FIG. 6, the seal member 61 for sealing the openings 38 is sandwiched between the column 21 and the like and the partition wall 33 and the like. For example, a seal member 62 (see the hatched portion in FIG. 6) is sandwiched between the partition wall 33 (see the partition wall 33a and the two-dot chain line in FIG. 6) and the column 21 and the like which are installed so as to cover the opening 38a. A seal member 63 (see the hatched portion in FIG. 6) is sandwiched between the partition wall 33 (see the partition wall 33b and the two-dot chain line in FIG. 6) and the column 21 and the like which are installed so as to cover the opening 38b. The seal member 61 extends so as to surround the openings 38. Further details of the seal member 61 will be described later.

Next, the internal configuration of the housing 2 will be described. Specifically, the configuration for circulating nitrogen in the housing 2 and the surrounding configuration thereof, and the devices and the like arranged in the transfer chamber 41 will be described.

The configuration for circulating nitrogen in the housing 2 and the surrounding configuration thereof will be described with reference to FIGS. 3 to 5. As shown in FIG. 5, a circulation path for circulating nitrogen is formed in the internal space 40 of the housing 2. The circulation path is defined by the transfer chamber 41, the FFU installation chamber 42, and a return path 43. As an overview, in the internal space 40, clean nitrogen is sent downward from the FFU installation chamber 42. After reaching the lower end portion of the transfer chamber 41, nitrogen rises through the return path 43 and returns to the FFU installation chamber 42 (see arrows in FIG. 5).

The FFU 44 arranged on the support plate 37 and a chemical filter 45 arranged on the FFU 44 are provided in the FFU installation chamber 42. The FFU 44 includes a fan 44a and a filter 44b. The FFU 44 sends nitrogen in the FFU installation chamber 42 downward by the fan 44a, and removes particles (not shown) contained in the nitrogen by the filter 44b. The chemical filter 45 is designed to remove, for example, an active gas and the like brought into the internal space 40 from the substrate processing apparatus 6. The nitrogen cleaned by the FFU 44 and the chemical filter 45 is sent from the FFU installation chamber 42 to the transfer chamber 41 through the opening 37a formed in the support plate 37. The nitrogen sent to the transfer chamber 41 forms a laminar flow and flows downward.

The return path 43 is formed in the columns 21 to 24 (column 23 in FIG. 5) arranged at the front end portion of the housing 2 and the support plate 37. That is, the columns 21 to 24 are hollow. Spaces 21a to 24a through which nitrogen can pass are formed in the columns 21 to 24, respectively (see FIG. 4). That is, each of the spaces 21a to 24a constitutes the return path 43. The return path 43 is in communication with the FFU installation chamber 42 through an opening 37b formed at the front end portion of the support plate 37 (see FIG. 5).

The return path 43 will be described more specifically with reference to FIG. 5. Although the column 23 is shown in FIG. 5, the same applies to other columns 21, 22, and 24. An introduction duct 27 for facilitating the flow of nitrogen in the transfer chamber 41 into the return path 43 (space 23a) is attached to the lower end portion of the column 23. An opening 27a is formed in the introduction duct 27 so that the nitrogen that has reached the lower end portion of the transfer chamber 41 can flow into the return path 43. On the upper portion of the introduction duct 27, there is formed an enlarged portion 27b which spreads backward as it goes downward. A fan 46 is arranged below the enlarged portion 27b. The fan 46 is driven by a motor (not shown). The fan 46 sucks the nitrogen that has reached the lower end portion of the transfer chamber 41 into the return path 43 (the space 23a in FIG. 5) and sends the nitrogen upward to return the nitrogen to the FFU installation chamber 42. The nitrogen returned to the FFU installation chamber 42 is cleaned by the FFU 44 and the chemical filter 45, and is sent again to the transfer chamber 41. As described above, the nitrogen can be circulated in the circulation path.

Furthermore, as shown in FIG. 3, a supply pipe 47 for supplying nitrogen to the internal space 40 is connected to the side portion of the FFU installation chamber 42. The supply pipe 47 is connected to a nitrogen supply source 111. The supply valve 112 (gas supply unit of the present disclosure) capable of changing the supply amount of nitrogen per unit time is provided in the middle of the supply pipe 47. By adjusting the opening degree of the supply valve 112, the flow rate of nitrogen supplied from the supply source 111 to the internal space 40 can be adjusted to 0 to 500 L/min. Furthermore, as shown in FIG. 5, a discharge pipe 48 for discharging the gas in the circulation path is connected to the front end portion of the transfer chamber 41. The discharge pipe 48 is connected to, for example, an exhaust port (not shown). The discharge valve 113 (gas discharge unit of the present disclosure) capable of changing the discharge amount of the gas in the circulation path per unit time is provided in the middle of the discharge pipe 48. The supply valve 112 and the discharge valve 113 are electrically connected to the control device 5 (see FIG. 2). Thus, it is possible to appropriately supply and discharge nitrogen to and from the internal space 40. For example, when an increase in the oxygen concentration in the internal space 40 is detected by the oxygen concentration meter 55, the control device 5 temporarily increases the opening degree of the supply valve 112 to temporarily supply a large amount of nitrogen from the supply source 111 to the internal space 40 through the supply pipe 47. Furthermore, as described above, the control device 5 changes (feed-back controls) the opening degree of the discharge valve 113 according to the pressure in the internal space 40, and discharges oxygen together with nitrogen via the discharge pipe 48. In this way, the control device 5 sets the oxygen concentration in the internal space 40 to, for example, less than 100 ppm. Alternatively, the control device 5 may change the opening degree of the discharge valve 113 according to the opening degree of the supply valve 112 (i.e., the supply amount of nitrogen). That is, for example, the control device 5 may change the opening degree of the discharge valve 113 together with the opening degree of the supply valve 112, and restart the feed-back control after a predetermined time has elapsed.

Furthermore, the control device 5 controls the supply valve 112 and the discharge valve 113 based on the value of the pressure gauge 56 (see FIG. 2). Thus, the pressure in the internal space 40 is kept slightly (e.g., about 10 Pa) higher than the pressure in the external space 7.

Next, the devices and the like arranged in the transfer chamber 41 will be described with reference to FIGS. 3 and 4. As shown in FIGS. 3 and 4, in the transfer chamber 41, there are arranged the above-described transfer robot 3, a controller storage box 51, a measurement instrument storage box 52, and the aligner 54. The controller storage box 51 is installed, for example, on the left side of the base 3a of the transfer robot 3 (see FIG. 3) and is arranged so as not to interfere with the arm mechanism 3b (see FIG. 3). The robot controller 11 described above is stored in the controller storage box 51. The measurement instrument storage box 52 is installed, for example, on the right side of the base 3a, and is arranged so as not to interfere with the arm mechanism 3b. The measurement instrument storage box 52 can accommodate the measurement instruments such as the oxygen concentration meter 55, the pressure gauge 56, the hygrometer 57 and the like described above (see FIG. 2).

The aligner 84 is used to detect how much a holding position of the wafer W held by the arm mechanism 3b of the transfer robot 3 (see FIG. 3) deviates from a target holding position. For example, the wafer W may be slightly moved inside the FOUP 100 (see FIG. 1) transferred by the OHT (not shown) described above. Therefore, the transfer robot 3 once places the unprocessed wafer W, which is taken out of the FOUP 100, on the aligner 54. The aligner 54 measures how far the wafer W is held by the transfer robot 3 from the target holding position, and sends the measurement result to the robot controller 11. The robot controller 11 corrects the holding position in the arm mechanism 3b based on the above measurement result, controls the arm mechanism 3b to hold the wafer W at the target holding position, and causes the arm mechanism 3b to transfer the wafer W to the load lock chamber 6a of the substrate processing apparatus 6. As a result, the wafer W can be normally processed by the substrate processing apparatus 6.

The present inventor has initially studied to use a general 0-ring as the seal member 61 for sealing the opening 38 (see FIG. 6) in the EFEM 1 having the above configuration. In order to crush the O-ring, it is necessary to apply a pressing force of a certain level or more, and it is required that the column 21 and the like and the partition wall 33 and the like have rigidity enough to withstand the pressing force. However, when the rigidity of these members is to be increased, it is necessary to manufacture the column 21 and the like and the partition wall 33 and the like with a member obtained by cutting a thick plate instead of a sheet metal. This significantly increases the manufacturing cost such as the material cost, the processing cost or the like. In addition, for example, when the partition wall 33 and the like are attached or detached during the maintenance of the EFEM, it is necessary to carry the heavy members, which causes a problem that the workability is extremely deteriorated. Thus, in the EFEM 1, the following configuration of the seal member 61 and the surroundings thereof is adopted in order to seal the housing 2 even when the column 21 and the like and the partition wall 33 and the like do not have high rigidity.

Detailed Configuration of Seal Member and Surroundings Thereof

Figure 7A:
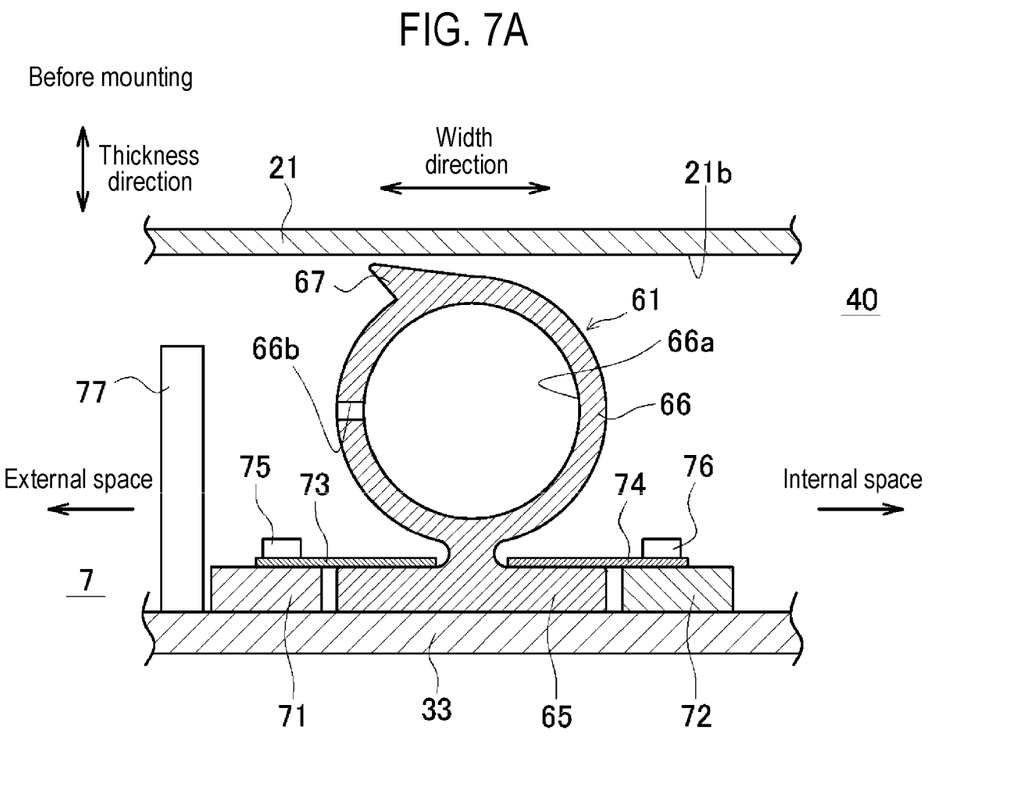
FIGS. 7A and 7B are views showing a configuration of the seal member and surroundings thereof.
Figure 7B:
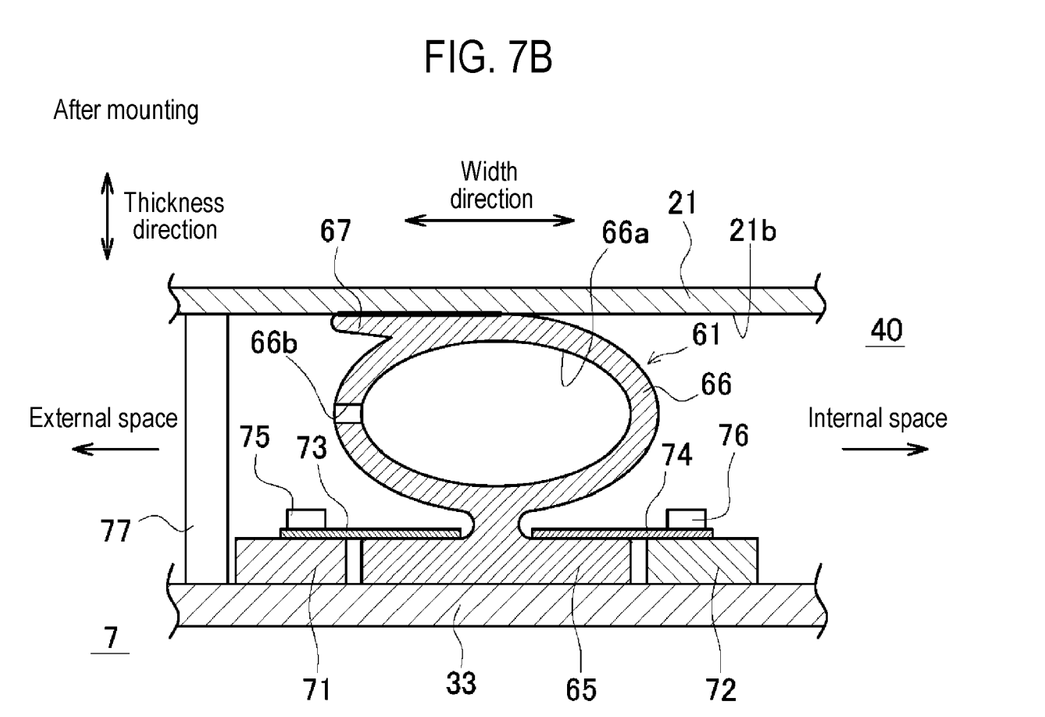

Detailed configuration of the seal member 61 and the surroundings thereof will be described with reference to FIGS. 6 to 7B. FIG. 7A is a sectional view taken along line VII-VII in FIG. 6, showing a state before the partition wall 33 is attached to the column 21. FIG. 7B is a view showing a state after the partition wall 33 shown in FIG. 7A is attached to the column 21. In the following description, the direction in which the seal member 61 extends is defined as an extension direction (see FIG. 6). The direction orthogonal to the extension direction and parallel to a contact surface 21b (see FIGS. 7A and 7B) of the column 21 that makes contact with the seal member 61 is defined as a width direction of the seal member 61. In the width direction, the left side on the drawing sheet surface in FIGS. 7A and 7B is defined as the external space 7 side, and the right side on the drawing sheet surface in FIGS. 7A and 7B is defined as the internal space 40 side. The direction orthogonal to both the extension direction and the width direction is defined as a thickness direction of the seal member 61. In the following description, as an example, a portion of the seal member 61 sandwiched between the column 21 and the partition wall 33 will be described. Portions of the seal member 61 sandwiched between other columns and other partition walls has the same configuration.

The seal member 61 applied to the EFEM 1 is made of, for example, rubber called EPDM (ethylene propylene diene rubber). The seal member 61 is formed into a linear shape by, for example, extrusion molding, and is then joined in an annular shape by vulcanization joining. Thus, contamination of the wafer W as a semiconductor substrate is suppressed as compared with the case where end portions in the extension direction of the seal member 61 are bonded to each other with an ordinary adhesive agent containing siloxane or the like. The seal member 61 may be any seal member as long as it does not contaminate the wafer W as a semiconductor substrate, and may be made of another elastic member such as fluorine rubber or nitrile rubber.

As shown in FIGS. 7A and 7B, the seal member 61 includes a base 65, a main body 66, and a protrusion 67. The seal member 61 is sandwiched and compressed between the column 21 and the partition wall 33, thereby sealing the opening 38 (see FIG. 6) by the partition wall 33 and separating the internal space 40 and the external space 7 from each other. In FIGS. 7A and 7B, the left side on the drawing sheet surface is the external space 7 side, and the right side on the drawing sheet surface is the internal space 40 side. The hollow main body 66 extends from the base 65 fixed to the partition wall 33 toward the column 21. The thickness-direction tip end of the main body 66 and the protrusion 67 make contact with the contact surface 21b of the column 21. Flatness of the surface of the partition wall 33 that makes contact with the base 65 and flatness of the contact surface 21b are, for example, 0.5 mm/m to 5 mm/m.

The base 65 is a portion for fixing the seal member 61 to the partition wall 33. As shown in FIGS. 7A and 7B, the base 65 is a flat plate-shaped portion, and is formed at the partition-side end of the seal member 61 in the thickness direction. The base 65 extends in the width direction. Base plates 71 and 72 having the same thickness as the base 65 (or slightly thinner than the base 65) are arranged on both sides of the base 65 in the width direction. On the side of the column 21 of the base 65 and the base plates 71 and 72 in the thickness direction, there are arranged a mounting plate 73 that straddles the base 65 and the base plate 71, and a mounting plate 74 that straddles the base 65 and the base plate 72. For example, the base plate 71 and the mounting plate 73 are threadedly fixed to the partition wall 33 by a screw 75. The base plate 72 and the mounting plate 74 are threadedly fixed to the partition wall 33 by a screw 76. Thus, both side portions of the base 65 in the width direction are pressed toward the partition wall 33 by the mounting plates 73 and 74, and the seal member 61 is fixed to the partition wall 33. This facilitates handling of the seal member 61 at the time of attaching and detaching the partition wall 33, as compared with the case where the seal member 61 is not fixed.

The main body 66 is a portion in which a cross section orthogonal to the extension direction has a hollow shape. The main body 66 is more easily compressed than a solid O-ring. The main body 66 has a circular cross section in an uncompressed state. However, the cross sectional shape is not limited thereto. A hollow 66a is formed inside the main body 66. In addition, a gas vent hole 66b that brings the hollow 66a and the outside of the main body 66 into communication with each other is formed in a part of the main body 66 in the extension direction. The gas vent hole 66b is formed on the side of the external space 7 (the left side on the drawing sheet surface) of the main body 66 in the width direction. Thus, when the main body 66 is compressed (see FIG. 7B), the gas in the hollow 66a can escape to the external space 7. Therefore, as compared with the case where the gas vent hole 66b is not formed, a repulsive force when the main body 66 is compressed is weakened so that the main body 66 is more easily compressed. Only one gas vent hole 66b may be formed in the extension direction. However, the number of gas vent holes 66b is not limited thereto.

The main body 66 of the seal member 61 is hollow and is easily compressed. However, a sealing force of the main body 66 is not so high when compared with the O-ring or the like having a solid cross section. The seal member 61 is configured to maintain sealability, for example, when the pressure difference between the internal space 40 and the external space 7 is 3000 Pa(G) or less. In other words, when the pressure difference exceeds 3000 Pa(G), the gas may possibly leak from the space having a high pressure to the space having a low pressure. However, as described above, the pressure difference between the internal space 40 and the external space 7 is small (about 10 Pa). Therefore, it is possible to seal the housing 2 with such a sealing force.

The protrusion 67 is formed at a portion of the seal member 61 that makes contact with the column 21 (one of the frame member and the cover member of the present disclosure). In other words, the protrusion 67 protrudes from an end of the main body 66 on the side of the column 21 in the thickness direction. The protrusion 67 protrudes in the width direction toward the external space 7 (i.e., toward the space in which the pressure is lower than that of the internal space 40). Thus, when the main body 66 is compressed (see FIG. 7B), the contact area with the contact surface 21b of the column 21 increases (see the thick line in FIG. 7B). A portion of the main body 66 on the side opposite to the protrusion 67 in the width direction is curved toward the external space 7. That is, the protrusion 67 is formed only on the side of the external space 7 where the pressure is low. Therefore, when the pressure in the internal space 40 becomes considerably higher than that in the external space 7 (exceeds 3000 Pa(G) described above), there is no resistance caused by the protrusion 67. Therefore, the nitrogen in the circulation path can easily escape to the external space 7. Accordingly, the seal member 61 is prevented from being broken when the pressure difference increases.

A spacer 77 is arranged between the column 21 and the partition wall 33 in the thickness direction. The spacer 77 is a columnar member for generating a predetermined distance between the column 21 and the partition wall 33 when the partition wall 33 is attached to the column 21. In the present embodiment, the spacer 77 is provided on the column 21. Therefore, it is possible to simplify the configuration of the partition wall 33 and to suppress an increase in the weight of the partition wall 33 (i.e., it is possible to facilitate the handling of the partition wall 33). When the partition wall 33 is attached to the column 21, the distance between the column 21 and the partition wall 33 is prevented from becoming equal to or less than the thickness of the spacer 77. This prevents the seal member 61 from being over-compressed. Although not shown, a plurality of spacers 77 is provided in the extension direction of the seal member 61. The spacers 77 may be provided on the partition wall 33. Alternatively, the spacers 77 may be provided on both of the partition wall 33 and the column 21.

A size of the seal member 61 will be described. A length of the seal member 61 in the extension direction is, for example, 1000 mm to 6000 mm. A size of the seal member 61 in the width direction is, for example, 10 mm to 30 mm. A size of the seal member 61 in the thickness direction is, for example, 10 mm to 30 mm. The outer diameter of the annular portion is, for example, 8 mm to 25 mm, and the thickness thereof is, for example, 1 to 5 mm.

In the EFEM 1 having the above configuration, when the partition wall 33 is attached to the column 21 as shown in FIG. 7B, the main body 66 and the protrusion 67 are compressed and elastically deformed by the pressing force acting between the column 21 and the partition wall 33.

Therefore, the seal member 61 is in close contact with both the partition wall 33 and the column 21, and the internal space 40 and the external space 7 are separated from each other. As described above, the frame member such as the column 21 and the like and the cover member such as the partition wall 33 and the like are formed of a sheet metal, and the rigidity thereof is not high as compared with a thick plate. Even with such a configuration, the seal member 61 having a hollow cross section can be compressed with a small pressing force. Therefore, the column 21, the partition wall 33 and the like are prevented from being bent by the repulsive force of the seal member 61.

As described above, the seal member 61 is an elastic member having a hollow cross section and is, therefore, easily bent even with a small pressing force. That is, the seal member 61 sandwiched between the frame member such as the column 21 and the like and the cover member such as the partition wall 33 and the like is easily compressed, and the contact areas between the seal member 61 and the frame member and between the seal member 61 and the cover member are easily increased. Therefore, the seal member 61 can be brought into close contact with the frame member and the cover member with a small pressing force. As a result, even when the frame member and the cover member are formed of a sheet metal having low rigidity, the frame member and the cover member can withstand the pressing force for compressing the seal member 61. In general, the hollow seal member 61 is apt to deteriorate in sealability when the pressure difference between the internal space 40 and the external space 7 is large. However, in the present embodiment, it is assumed that the pressure difference between the internal space 40 and the external space 7 is less than or equal to a predetermined value. Therefore, the deterioration of sealability is suppressed. As described above, the housing 2 can be sealed even when the frame member and the cover member do not have high rigidity.

Furthermore, the frame member such as the column 21 and the like and the cover member such as the partition wall 33 and the like are formed of a sheet metal as described above. Therefore, as compared with a case where, for example, a thick plate is cut to form the frame member and the cover member, it is possible to suppress an increase in the manufacturing cost such as the material cost, the processing cost or the like. Furthermore, it is possible to suppress an increase in the weight of the cover member. Therefore, for example, when it is necessary to attach or detach the cover member during the maintenance of the EFEM 1, it is possible to easily 19 handle the cover member.

Furthermore, when the cover member is attached to the frame member, i.e., when the seal member 61 is compressed, the gas is discharged from the hollow 66a of the seal member 61 through the gas vent hole 66b. Therefore, as compared with a case where the gas vent hole 66b is not formed, it is possible to suppress the pressure in the hollow 66a from rising at the time of compressing the seal member 61, and to weaken the repulsive force applied by the seal member 61. Accordingly, the seal member 61 can be reliably compressed with a small pressing force.

In the present disclosure, the EFEM 1 is composed of the frame member and the cover member, which are made of a sheet metal. The surface flatness of the frame member and the cover member is inferior to that of the frame member and the cover member created by a cutting process. However, according to the configuration including the seal member 61 of the present disclosure, the seal member 61 is deformed by a small pressing force so as to follow the surface. Therefore, it is possible to obtain the sealability required in the $N_2$ circulation type EFEM 1. According to the present embodiment, in the frame member and the cover member having the surface flatness of 0.5 to 5 mm/m, the sealability (leakage amount of 1.5 L/min or less) required in the $N_2$ circulation type EFEM 1 can be obtained without any problem. Furthermore, even when the nitrogen supply flow rate was 200 L/min or less, the oxygen concentration of less than 100 ppm can be realized in the transfer chamber 41. That is, it is possible to prevent the concentration of gases other than nitrogen from increasing.

The flatness of the frame member and the cover member is calculated in such a way that when a straight line is drawn from a valley to a valley (or from a peak to a peak) between two arbitrary points (e.g., 500 mm or more) of a the member, the distance between the straight line and the wave peak (wave valley) is measured. For example, the flatness of the frame member and the cover member can be measured by a contact or non-contact type three-dimensional measurement device.

Furthermore, the spacer 77 maintains the distance between the frame member such as the column 21 and the like and the cover member such as the partition wall 33 and the like. Therefore, the thickness of the seal member 61 is prevented from becoming smaller than the above distance. Accordingly, by appropriately maintaining the distance between the frame member and the cover member, it is possible to prevent the seal member 61 from being overcompressed.

Furthermore, the contact area between the seal member 61 and the frame member such as the column 21 and the like can be increased by the protrusion 67 protruding in the width direction. Therefore, it is possible to improve the sealability of the housing 2.

Moreover, the protrusion 67 is formed only on the side of the external space 7 (i.e., on the side of the internal space 40 or the external space 7, whichever has a lower pressure) in the width direction. For this reason, when the pressure difference between the internal space 40 and the external space 7 increases, the gas relatively easily escapes into the external space 7. Therefore, the seal member 61 can be prevented from being broken.

Next, modifications of the above-described embodiment will be described. Components having the same configurations as those of the above-described embodiment are designated by like reference numerals, and the description thereof will be appropriately omitted.

(1) In the above-described embodiment, the protrusion 67 is configured to protrude only toward the external space 7 in the width direction. However, the present disclosure is not limited thereto. The protrusion 67 may protrude toward the internal space 40. Alternatively, the protrusion 67 may protrude toward both of the external space 7 and the internal space 40.

(2) In the above-described embodiment, the protrusion 67 is formed in the portion of the seal member 61 that makes contact with the column 21. However, the present disclosure is not limited thereto. That is, the base 65 may be fixed to the column 21, and the protrusion 67 may be formed in a portion of the seal member 61 that makes contact with the partition wall 33.

(3) In the above-described embodiment, the spacer 77 is arranged between the column 21 and the partition wall 33. However, the present disclosure is not limited thereto. That is, the spacer 77 may not be arranged. In this case, it is preferable that the distance between the column 21 and the like and the partition wall 33 and the like be properly maintained so that the seal member 61 is not excessively compressed when the partition wall 33 and the like are attached to the column 21 and the like.

(4) In the above-described embodiment, the gas vent hole 66b of the seal member 61 is formed in the main body 66 on the side of the external space 7 in the width direction. However, the present disclosure is not limited thereto. That is, the gas vent hole 66b may be formed on the side of the internal space 40

(5) In the above-described embodiment, the frame member (the columns 21 to 26, the partition walls 31 and 32, and the support plate 37) and the cover member (the partition walls 33 to 36) are all formed of a sheet metal. However, the present disclosure is not limited thereto. For example, the cover member may be formed of a sheet metal, and the frame member may be manufactured by cutting a thick plate.

(6) In the above-described embodiment, the present disclosure is applied to the EFEM 1. However, the present disclosure is not limited thereto. For example, the present disclosure may be applied to an isolator in which a work space for culturing cells is formed (see Japanese laid-open publication No. 2011-167405). In addition, the present disclosure may be applied to sealing equipment in which a pressure difference having a predetermined value or less (e.g., 3000 Pa(G) or less described above) exists between an internal space and an external space. Either the internal space or the external space may have a higher pressure. The material of the seal member 61 may be appropriately determined according to the environment. The same applies to a method of joining the extension-direction ends of the seal member 61.

EXPLANATION OF REFERENCE NUMERALS

1: EFEM (sealing equipment), 2: housing, 5: control device (controller), 7: external space, 21 to 26: column (frame member), 31 and 32: partition wall (frame member), 33 to 36: partition wall (cover member), 37: support plate (frame member), 38: opening, 40: internal space, 61: seal member, 66a: hollow, 66b: gas vent hole, 67: protrusion, 77: spacer, 112: supply valve (gas supply unit), 113: discharge valve (gas discharge unit)

What is claimed is:

1. A sealing equipment used in an EFEM (Equipment Front End Module) in which a pressure difference having a predetermined value or less exists between an internal space of a housing and an external space of the housing, the housing comprising:
    a frame member of the EFEM, which is assembled so as to form an opening;
    a cover member of the EFEM, which is attached to the frame member so as to cover the opening; and
    a seal member sandwiched between the frame member and the cover member and configured to extend so as to surround the opening,
    wherein the frame member and the cover member are formed of a sheet metal, and
    wherein the seal member is an elastic member having a hollow cross section orthogonal to an extension direction of the seal member.

2. The sealing equipment of claim 1, wherein a gas vent hole configured to bring a hollow of the seal member and the external space into communication with each other is formed in the seal member.

3. The sealing equipment of claim 2, further comprising a spacer arranged between the frame member and the cover member.

4. The sealing equipment of claim 3, wherein the seal member includes a protrusion formed in a portion that makes a contact with one of the frame member and the cover member, and
    wherein the protrusion extends in a width direction of the seal member, which is orthogonal to the extension direction and parallel to a surface of one of the frame member and the cover member that makes a contact with the seal member.

5. The sealing equipment of claim 4, wherein the protrusion is formed only on a side of one of the internal space and the external space, whichever has a lower pressure, in the width direction.

6. The sealing equipment of claim 5, further comprising:
    a gas supply unit configured to supply an inert gas;
    a gas discharge unit configured to discharge a gas in the internal space; and
    a controller configured to control the gas supply unit and the gas discharge unit,
    wherein the controller is configured to maintain an oxygen concentration in the internal space at less than 100 ppm by supplying the inert gas at 200 L/min or less with the gas supply unit and by discharging the gas in the internal space with the gas discharge unit according to a supply amount of the inert gas or a pressure in the internal space.

7. The sealing equipment of claim 1, further comprising a spacer arranged between the frame member and the cover member.

8. The sealing equipment of claim 1, wherein the seal member includes a protrusion formed in a portion that makes a contact with one of the frame member and the cover member, and
    wherein the protrusion extends in a width direction of the seal member, which is orthogonal to the extension direction and parallel to a surface of one of the frame member and the cover member that makes a contact with the seal member.

9. The sealing equipment of claim 1, further comprising:
    a gas supply unit configured to supply an inert gas;
    a gas discharge unit configured to discharge a gas in the internal space; and
    a controller configured to control the gas supply unit and the gas discharge unit,
    wherein the controller is configured to maintain an oxygen concentration in the internal space at less than 100 ppm by supplying the inert gas at 200 L/min or less with the gas supply unit and by discharging the gas in the internal space with the gas discharge unit according to a supply amount of the inert gas or a pressure in the internal space.

10. The sealing equipment of claim 1, wherein the pressure difference between the internal space of the housing and the external space of the housing is 3000 Pa or less,
    wherein at least one of the frame member and the cover member is formed of the sheet metal having a thickness of 6 mm or less,
    wherein the frame member and the cover member include contact surfaces that make contact with the seal member and have a flatness of 0.5 mm/m to 5 mm/m, and
    wherein the seal member is an elastic member having a hollow cross section orthogonal to an extension direction of the seal member.

11. The sealing equipment of claim 10, further comprising:
- a gas supply unit configured to supply an inert gas;
- a gas discharge unit configured to discharge a gas in the internal space; and
- a controller configured to control the gas supply unit and the gas discharge unit,
- wherein the controller is configured to maintain an oxygen concentration in the internal space at less than 100 ppm by supplying the inert gas at 200 L/min or less with the gas supply unit and by discharging the gas in the internal space with the gas discharge unit according to a supply amount of the inert gas or a pressure in the internal space.

12. A sealing equipment in which a pressure difference having a predetermined value or less exists between an internal space of a housing and an external space of the housing, the housing comprising:
- a frame member assembled so as to form an opening;
- a cover member attached to the frame member so as to cover the opening; and
- a seal member sandwiched between the frame member and the cover member and configured to extend so as to surround the opening,
- wherein the frame member and the cover member are formed of a sheet metal, and
- wherein the seal member is an elastic member having a hollow cross section orthogonal to an extension direction of the seal member,
- wherein a gas vent hole configured to bring a hollow of the seal member and the external space into communication with each other is formed in the seal member,
- wherein a spacer is sandwiched between the frame member and the cover member,
- wherein the seal member includes a protrusion formed in a portion that makes a contact with one of the frame member and the cover member,
- wherein the protrusion extends in a width direction of the seal member, which is orthogonal to the extension direction and parallel to a surface of one of the frame member and the cover member that makes a contact with the seal member, and
- wherein the protrusion is formed only on a side of one of the internal space and the external space, whichever has a lower pressure, in the width direction.

13. The sealing equipment of claim 12, further comprising:
- a gas supply unit configured to supply an inert gas;
- a gas discharge unit configured to discharge a gas in the internal space; and
- a controller configured to control the gas supply unit and the gas discharge unit,
- wherein the controller is configured to maintain an oxygen concentration in the internal space at less than 100 ppm by supplying the inert gas at 200 L/min or less with the gas supply unit and by discharging the gas in the internal space with the gas discharge unit according to a supply amount of the inert gas or a pressure in the internal space.

* * * * *